US012785358B2

(12) United States Patent
Cheng et al.

(10) Patent No.: US 12,785,358 B2
(45) Date of Patent: Nov. 3, 2026

(54) EPITAXIAL STRUCTURE AND SEMICONDUCTOR CHIP APPLYING SAME

(71) Applicant: Shenzhen Rubeust Technology Limited, Shenzhen (CN)

(72) Inventors: Chao-chen Cheng, Guangdong (CN); Xinqi Ding, Guangdong (CN); Ching-ming Tu, Guangdong (CN)

(73) Assignee: Shenzhen Rubeust Technology Limited, Shenzhen (CN)

( * ) Notice: Subject to any disclaimer, the term of this patent is extended or adjusted under 35 U.S.C. 154(b) by 782 days.

(21) Appl. No.: 18/166,452

(22) Filed: Feb. 8, 2023

(65) Prior Publication Data

US 2023/0187901 A1 Jun. 15, 2023

Related U.S. Application Data

(63) Continuation of application No. PCT/CN2021/112614, filed on Aug. 13, 2021.

(30) Foreign Application Priority Data

Aug. 13, 2020 (CN) ........................ 202021705512.5

(51) Int. Cl.
*H01S 5/042* (2006.01)
*H01S 5/34* (2006.01)

(52) U.S. Cl.
CPC ........ *H01S 5/0421* (2013.01); *H01S 5/04256* (2019.08); *H01S 5/34* (2013.01)

(58) Field of Classification Search
CPC . H01S 5/0421; H01S 5/04256; H10H 20/032; H10H 20/831; H10H 20/83; H10H 29/8321; H10H 29/831; H10H 29/032
See application file for complete search history.

(56) References Cited

U.S. PATENT DOCUMENTS

2019/0013649 A1* 1/2019 Vierheilig ............. H01S 5/1082
2020/0373736 A1* 11/2020 Kanskar .............. H01S 5/04256

FOREIGN PATENT DOCUMENTS

| | | |
|---|---|---|
| CN | 104600565 A | 5/2015 |
| CN | 108141010 A | 6/2018 |
| CN | 108352678 A | 7/2018 |
| CN | 213212654 U | 5/2021 |
| JP | 2002064247 A | 2/2002 |

OTHER PUBLICATIONS

International Search Report for PCT/CN2021/112614 dated Sep. 30, 2021 (5 pages).

* cited by examiner

*Primary Examiner* — Tod T Van Roy
*Assistant Examiner* — Delma R Forde
(74) *Attorney, Agent, or Firm* — Kenneth C. Booth; Booth Udall, PLC

(57) ABSTRACT

Provided are an epitaxial structure and a semiconductor chip applying same. The epitaxial structure comprises a quantum well structure, a P-type contact layer, and an electrode layer, which are stacked in sequence; the P-type contact layer comprises a first step part and a second step part that are disposed in a step shape, the second step part being closer to the quantum well structure relative to the first step part; the first step part and the second step part are filled with a first insulation part. By means of the described method, the anti-catastrophic optical mirror damage value of a semiconductor chip can be effectively improved.

10 Claims, 3 Drawing Sheets

EPITAXIAL STRUCTURE AND SEMICONDUCTOR CHIP APPLYING SAME

CROSS-REFERENCE TO RELATED APPLICATIONS

This application is a Continuation of International Patent Application No. PCT/CN2021/112614, filed on Aug. 13, 2021, which claims the benefit of and priority to Chinese Patent Application No. 202021705512.5, filed on Aug. 13, 2020, the contents of each of which are incorporated herein by reference in their entireties.

TECHNICAL FIELD

The present disclosure relates to the technical field of semiconductor laser light, and in particular, to an epitaxial structure and a semiconductor chip applying the same.

BACKGROUND

A semiconductor laser-pumped all-solid-state laser device is a new laser device that is emerged in the late 1980s. The overall efficiency of the semiconductor laser-pumped all-solid-state laser device is at least 10 times of that of a flash pump. Due to the decrease of the heat load output per unit, the semiconductor laser-pumped all-solid-state laser device can obtain a higher power, and the system life and the reliability of the semiconductor laser-pumped all-solid-state laser device are about 100 times of those of a flash pump system. Therefore, the technology of the semiconductor laser-pumped laser device brings new vitality for a solid laser device, so that the all-solid-state laser device has both characteristics of the solid laser device and the semiconductor laser device, and the emergence and the gradual development of the semiconductor laser-pumped all-solid-state laser device is a revolution for the solid laser device, and is also a development tendency for the solid laser device. Further, the semiconductor laser-pumped all-solid-state laser device has applied to various technical fields, such as laser information storage and processing, laser material processing, laser medicine and biology, laser communication, laser printing, laser spectroscopy, laser chemistry, laser separation of isotopes, laser nuclear fusion, laser projection display, laser detection and measurement, and military laser technology, and the semiconductor laser-pumped all-solid-state laser device has greatly promoted the technological progress in these fields and unprecedented development.

Increasing light output power and improving the reliability and the service life have always been the focus in the field of the semiconductor laser device. A catastrophic optical mirror damage is a non-ignored factor which affects the maximum output power and the reliability of a semiconductor laser device. A catastrophic optical mirror damage is caused by the following process: after a cavity surface region of the laser device absorbs high light radiation inside the resonance cavity, a temperature at this position exceeds a melting point thereof, thereby leading to melting of the cavity surface.

How to avoid a catastrophic optical mirror damage is an important problem to be solved.

SUMMARY

The present disclosure provides an epitaxial structure and a semiconductor chip applying the same to solve the problem of a catastrophic optical mirror damage in the related art.

To solve the above-mentioned technical problem, a technical solution of the present disclosure provides an epitaxial structure, including a quantum well structure, a P-type contact layer and an electrode layer. The quantum well structure, the P-type contact layer, and the electrode layer are stacked in sequence. The P-type contact layer includes a first step part and a second step part that are disposed in a step shape. The second step part is closer to the quantum well structure than the first step part. Each of the first step part and the second step part is filled with a first insulation part.

According to an embodiment of the present disclosure, a length of the first step part along a resonance cavity direction of the epitaxial structure is greater than a length of the second step part along the resonance cavity direction of the epitaxial structure.

According to an embodiment of the present disclosure, the length of the second step part along the resonance cavity direction of the epitaxial structure is greater than or equal to 1 um, and smaller than or equal to 30 um.

According to an embodiment of the present disclosure, a height of the first step part along a stacking direction of the P-type contact layer and the electrode layer is greater than a height of the second step part along the stacking direction of the P-type contact layer and the electrode layer.

According to an embodiment of the present disclosure, the height of the second step part along the stacking direction of the P-type contact layer and the electrode layer is greater than or equal to 1 nm, and smaller than or equal to 100 nm.

According to an embodiment of the present disclosure, the electrode layer includes a third step part, the third step part and the first step part are disposed in a step shape, and the third step part is filled with a second insulation part.

According to an embodiment of the present disclosure, a length of the third step part along a resonance cavity direction of the epitaxial structure is greater than a length of the first step part along the resonance cavity direction of the epitaxial structure.

According to an embodiment of the present disclosure, the epitaxial structure further includes a P-type cover layer and a first waveguide layer that are arranged between the P-type contact layer and the quantum well structure.

According to an embodiment of by the present disclosure, the epitaxial structure further comprises a second waveguide layer, an N-type cover layer, and an N-type base layer that are arranged in sequence at a side of the quantum well structure away from the P-type contact layer.

In order to solve the technical problem described above, another technical solution of the present disclosure provides a semiconductor chip including a substrate and the epitaxial structure described above, and the epitaxial structure is provided at the substrate.

The present disclosure can bring the following beneficial effects. Different from the prior art, by providing the step part at the P-type contact layer and filling the step part with the first insulation part, the radiation current can be effectively limited in the resonance cavity, so that the non-radiative recombination at the end surface region can be effectively suppressed, that is, the absorption of light at the end surface region can be reduced, and the catastrophic optical mirror damage value can be improved.

DESCRIPTION OF EMBODIMENTS

The technical solutions in embodiments of the present disclosure will be described below in conjunction with the accompanying drawings, and it should be noted that the embodiments described herein are merely some embodiments, rather than all embodiments of the present disclosure. Based on the embodiments of the present disclosure, all other embodiments obtained by those skilled in the art without creative efforts shall fall into a scope of the present disclosure.

Further, if the embodiments of the present disclosure describe a term of "first", "second" or the like, the term of "first", "second" or the like is merely for description purposes and shall not be illustrated as indicating or implying the relative importance thereof or indicating or implying the number of technical features. Thus, the features involving a term "first", "second" or the like may indicate or imply that at least one feature is included. In addition, the technical solutions in the various embodiments can be combined with each other if it is feasible for those skilled in the art; and if a combination of the technical solutions is contradictory or infeasible, this combination of the technical solutions shall be considered as not existing and is not within a scope of the present disclosure.

Referring to FIG. 1 to FIG. 5, the present disclosure provides an epitaxial structure 10 including a quantum well structure 100, a P-type contact layer 200, and an electrode layer 300 that are stacked in sequence.

Figure 1:
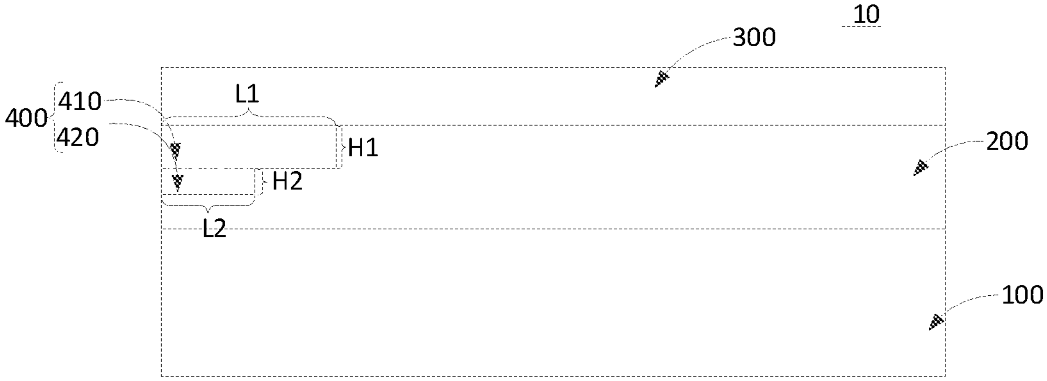
FIG. 1 is a schematic diagram of an epitaxial structure according to a first embodiment of the present disclosure.

As shown in FIG. 1, the P-type contact layer 200 includes a first step part 410 and a second step part 420. The first step part 410 and the second step part 420 may be disposed in a step shape. The second step part 420 is closer to the quantum well structure 100 than the first step part 410. In an embodiment, each of the first step part 410 and the second step part 420 is filled with a first insulation part 400. The first insulation part 400 may be formed by a material with no electric conductivity and good thermal conductivity, such as silicon dioxide, silicon carbide or aluminum nitride.

In an embodiment, the step structure can be formed by etching the P-type contact layer 200, and then the first insulation part 400 is formed at the step structure by the epitaxy of an insulation material such as silicon dioxide, silicon carbide or aluminum nitride. In this way, a radiation current can be effectively limited in the resonance cavity, thereby effectively suppressing non-radiative recombination at an end-surface region, namely reducing the absorption of light at the end-surface region, and thus improving an anti-catastrophic optical mirror damage value.

Further, the second step part 420 is closer to the quantum well structure 100. Thus, in contrast to performing quantum well mixing in other regions, the diffusion efficiency is higher and the heat treatment time required for the whole process is shorter when performing the quantum well mixing in the region below the second step part 420. That is, the diffusion efficiency of the doped material is higher and the mixing is easier, thereby avoiding that the mixed material is doped into other layers or doped laterally during the quantum well mixing process. That is, a damage to the whole epitaxial structure 10 during the manufacturing process is reduced, or redundant diffusion during the manufacturing process is reduced, and the damage to the cavity surface structure of the epitaxial structure 10 is reduced. Then, the absorption of light by the cavity surface is reduced, thereby improving the anti-catastrophic optical mirror damage value and thus improving the service life and the quality of the whole semiconductor chip.

Further, since the second step part 420 is closer to the quantum well structure 100, it can be more convenient to track the blue shift (PL blue shift) measurement during the quantum well mixing process.

Further, by providing the first step part 410 and the second step part 420, and providing the first insulation part 400 at the first step part 410 and the second step part 420, the quantum well mixing process can be performed directly below the first insulation part 400. In contrast to the implementation of processes such as ion injection, it is not required to relocate a region for the quantum well mixing process, and a region of the quantum well mixing process can be directly defined as a laser resonance cavity region, so that the process thereof can be effectively simplified, and the production costs can be reduced.

As shown in FIG. 1, a length L1 of the first step part 410 along a resonance cavity direction of the epitaxial structure 10 is greater than a length L2 of the second step part 420 along the resonance cavity direction of the epitaxial structure 10.

In an embodiment, the length L2 of the second step part 420 along the resonance cavity direction of the epitaxial structure 10 is greater than or equal to 1 um, and smaller than or equal to 30 um, for example, the length L2 of the second step part 420 along the resonance cavity direction of the epitaxial structure 10 is equal to 1 um, 10 um or 30 um.

As shown in FIG. 1, a height H1 of first step part 410 along a stacking direction of the P-type contact layer 200 and the electrode layer 300 is greater than a height H2 of the second step part 420 along the stacking direction of the P-type contact layer 200 and the electrode layer 300.

In an embodiment, the height H2 of the second step part 420 along the stacking direction of the P-type contact layer 200 and the electrode layer 300 is greater than or equal to 1 nm, and smaller than or equal to 100 nm, for example, the height H2 of the second step part 420 along the stacking direction of the P-type contact layer 200 and the electrode layer 300 is equal to 1 nm, 50 nm or 100 nm. The present disclosure does not limit thereto.

Figure 3:
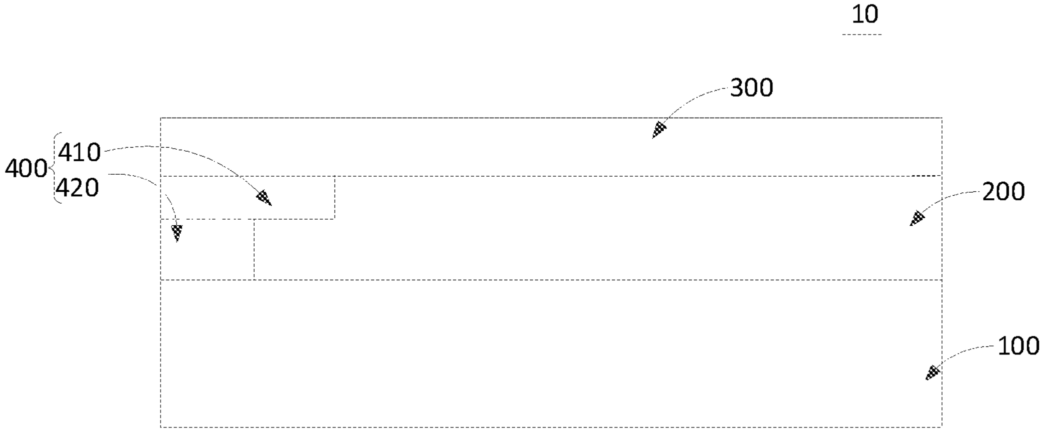
FIG. 3 is a schematic diagram of an epitaxial structure according to a third embodiment of the present disclosure.

As shown in FIG. 3, the first step part 410 and the second step part 420 as a whole runs through the P-type contact layer 200. That is, the second step part 420 directly contacts to the quantum well structure 100 and the first step part 410 directly contacts to the electrode layer 300.

Figure 4:
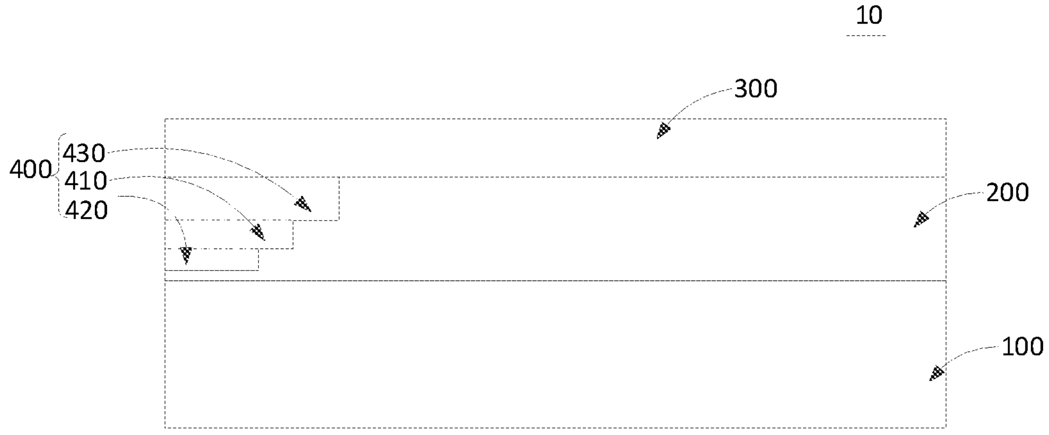
FIG. 4 is a schematic diagram of an epitaxial structure according to a third embodiment of the present disclosure.

As shown in FIG. 4, the P-type contact layer 200 may further include a fourth step part 430, and the fourth step part 430 and the first step part 410 are disposed in a step shape. The fourth step part 430 is also filled with the first insulation part 400.

Figure 2:
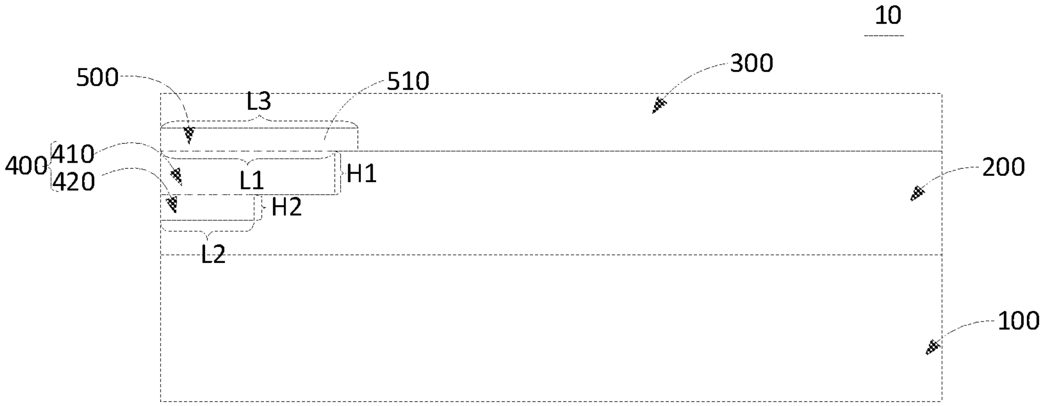
FIG. 2 is a schematic diagram of an epitaxial structure according to a second embodiment of the present disclosure.

As shown in FIG. 2, the electrode layer 300 includes a third step part 510. The third step part 510 and the first step part 410 are disposed in a step shape. In an embodiment, the third step part 510 is filled with a second insulation part 500. The second insulation part 500 may be integrated with the first insulation part 410. That is, in an embodiment, the first insulation part 400 and the second insulation part 500 may be formed simultaneously by using silicon dioxide.

In other embodiments, the third step part 510 and the fourth step part 430 may be disposed in a step shape.

In an embodiment, a length L3 of the third step part 510 in the resonance cavity direction of the epitaxial structure 10 is greater than the length L1 of the first step part 410 in the resonance cavity direction of the epitaxial structure 10.

Figure 5:
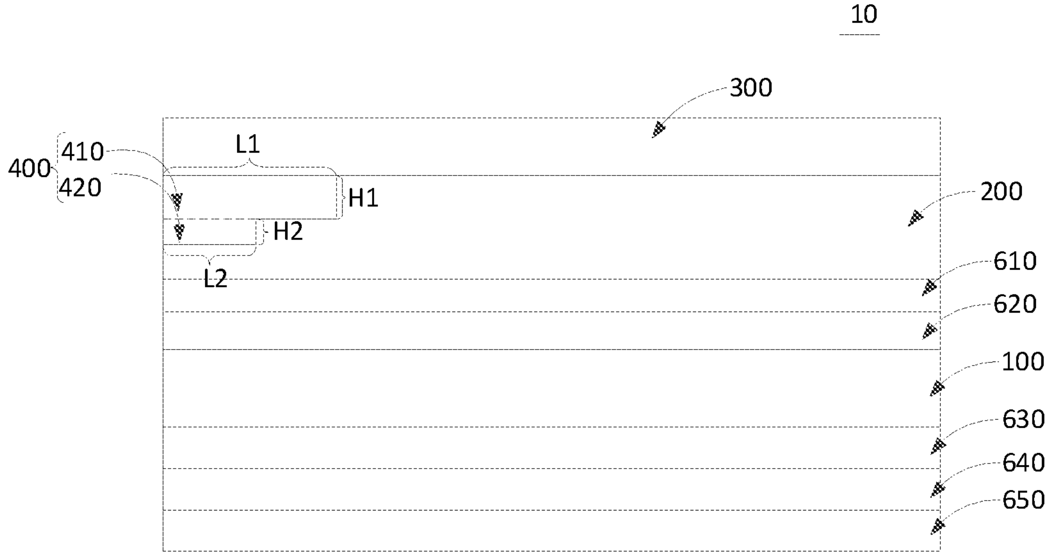
FIG. 5 is a schematic diagram of an epitaxial structure according to a third embodiment of the present disclosure.

As shown in FIG. 5, the epitaxial structure 10 further includes a P-type cover layer 610 and a first waveguide layer 620 that are provided between the P-type contact layer 200 and the quantum well structure 100.

As shown in FIG. 5, the epitaxial structure 10 further includes a second waveguide layer 630, an N-type cover layer 640, and an N-type base layer 650 that are sequentially arranged at a side of the quantum well structure 100 away from the P-type contact layer 200.

In an embodiment, a thickness of the N-type cover layer 640 along the stacking direction is generally greater than or equal to 500 nm, and smaller than or equal to 5000 nm, for example, the thickness of the N-type cover layer 640 along the stacking direction is equal to 500 nm, 3000 nm or 5000 nm. A thickness of the second waveguide layer 630 along the stacking direction is generally greater than or equal to 50 nm, and smaller than or equal to 250 nm, for example, the thickness of the second waveguide layer 630 along the stacking direction is equal to 50 nm, 200 nm or 250 nm. A thickness of the first waveguide layer 620 along the stacking direction is generally greater than or equal to 50 nm, and smaller than or equal to 250 nm, for example, the thickness of the first waveguide layer 620 along the stacking direction is equal to 50 nm, 100 nm, or 250 nm. A thickness of the P-type cover layer 610 along the stacking direction is generally greater than or equal to 500 nm, and smaller than or equal to 5000 nm, for example, the thickness of the P-type cover layer 610 along the stacking direction is equal to 500 nm, 2000 nm, or 5000 nm.

Figure 6:
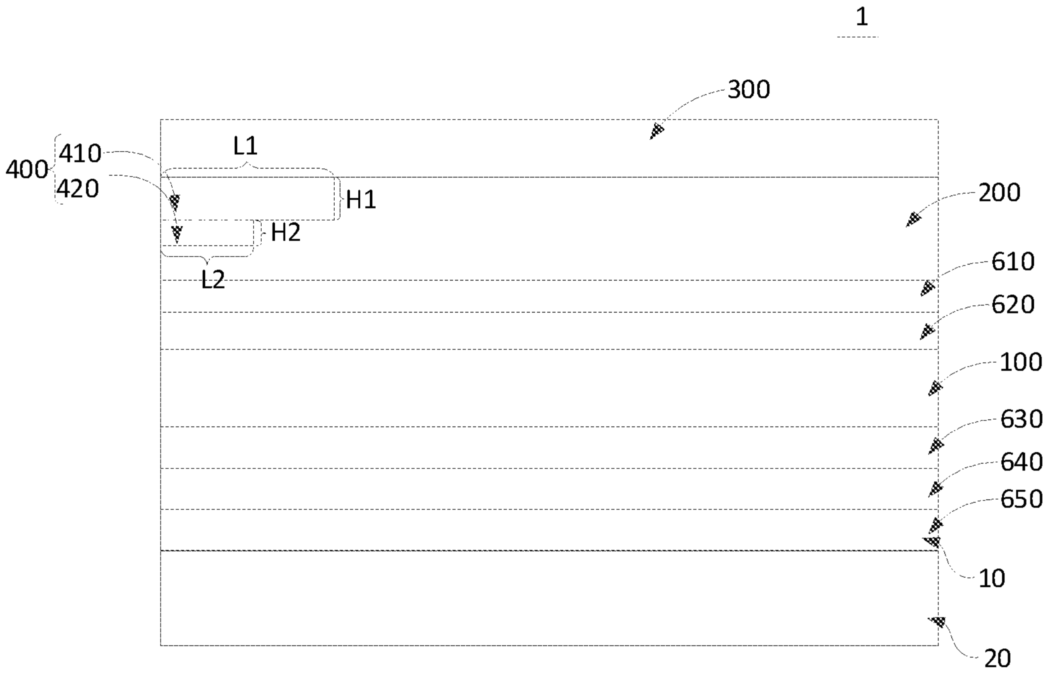
FIG. 6 is a schematic diagram of a semiconductor chip according to an embodiment of the present disclosure.

As shown in FIG. 6, the present disclosure further provides a semiconductor chip 1 including a substrate 20 and the epitaxial structure 10 according to any of the above embodiments, and the epitaxial structure 10 is provided at the substrate 20.

In summary, for the epitaxial structure and the semiconductor chip applying the epitaxial structure according to the present disclosure, the P-type contact layer 200 is etched to form the step structure, and then the first insulation part 400 is formed at the step structure by the epitaxy of the silicon dioxide, so that the radiation current can be effectively limited in the resonance cavity, and the non-radiative recombination at the end-surface region can be effectively suppressed, That is, the absorption of light at the end-surface region is reduced, thereby improving the catastrophic optical mirror damage value. Further, the first insulation part 400 in the present disclosure further includes the first step part 410 and second step part 420. As the second step part 420 is closer to the quantum well structure 100, when the quantum well mixing process occurs in the region below the second step part 420, the diffusion efficiency is higher, the heat treatment time required for the whole manufacturing process is shorter, thereby avoiding that the mixed material is doped into other layers during the quantum well mixing process. That is, a damage to the whole epitaxial structure 10 during the manufacturing process is reduced, or redundant diffusion during the manufacturing process is reduced, and the damage to the cavity surface structure of the epitaxial structure 10 is reduced. Then, the absorption of light by the cavity surface is reduced, thereby improving the anti-catastrophic optical mirror damage value and thus improving the service life and the quality of the whole semiconductor chip. Furthermore, since the second step part 420 is closer to the quantum well structure 100, it can be more convenient to track the blue shift (PL blue shift) measurement during the quantum well mixing process. Furthermore, the quantum well mixing process can be performed directly below the first insulation part 400 by providing the first insulation part 400. In contrast to the implementation of processes such as ion injection, it is not required to relocate the region for the quantum well mixing process, and a region of the quantum well mixing process can be directly defined as the laser resonance cavity region, so that the process can be effectively simplified, and the production costs can be reduced.

The above description merely illustrates some embodiments of the present disclosure, and does not constitute a limitation to a scope of the present disclosure. All the equivalent results or equivalent process transformations made by using the specification and drawings of the present disclosure, or directly or indirectly applied in other related technical fields, shall fall into a scope of the present disclosure.

What is claimed is:

1. An epitaxial structure, comprising:
a quantum well structure;
a P-type contact layer; and
an electrode layer,
wherein the quantum well structure, the P-type contact layer, and the electrode layer are stacked in sequence,
wherein the P-type contact layer comprises a first step part and a second step part that are disposed in a step shape, and the second step part is closer to the quantum well structure than the first step part, and
wherein each of the first step part and the second step part is filled with a first insulation part, and in a direction along which the P-type contact layer and the electrode layer are stacked, the second step part is separated from the quantum well structure by the P-type contact layer, in such a manner that the second step part is not in contact with the quantum well structure.

2. The epitaxial structure according to claim 1, wherein a length of the first step part along a resonance cavity direction of the epitaxial structure is greater than a length of the second step part along the resonance cavity direction of the epitaxial structure.

3. The epitaxial structure according to claim 2, wherein the length of the second step part along the resonance cavity direction of the epitaxial structure is greater than or equal to 1 um, and smaller than or equal to 30 um.

4. The epitaxial structure according to claim 1, a height of the first step part along a stacking direction of the P-type contact layer and the electrode layer is greater than a height of the second step part along the stacking direction of the P-type contact layer and the electrode layer.

5. The epitaxial structure according to claim 4, wherein the height of the second step part along the stacking direction of the P-type contact layer and the electrode layer is greater than or equal to 1 nm, and smaller than or equal to 100 nm.

6. The epitaxial structure according to claim 1, wherein the electrode layer includes a third step part, the third step part and the first step part are disposed in a step shape, and the third step part is filled with a second insulation part.

7. The epitaxial structure according to claim 6, wherein a length of the third step part along a resonance cavity direction of the epitaxial structure is greater than a length of the first step part along the resonance cavity direction of the epitaxial structure.

8. The epitaxial structure according to claim 1, further comprising a P-type cover layer and a first waveguide layer that are provided between the P-type contact layer and the quantum well structure.

9. The epitaxial structure according to claim 8, wherein the epitaxial structure further comprises a second waveguide layer, an N-type cover layer, and an N-type base layer that are arranged in sequence at a side of the quantum well structure away from the P-type contact layer.

10. A semiconductor chip comprising a substrate and an epitaxial structure, wherein the substrate comprises:

a quantum well structure;

a P-type contact layer; and an electrode layer, wherein the quantum well structure, the P-type contact layer, and the electrode layer are stacked in sequence, wherein the P-type contact layer comprises a first step part and a second step part that are disposed in a step shape, and the second step part is closer to the quantum well structure than the first step part, wherein each of the first step part and the second step part is filled with a first insulation part, and in a direction along which the P-type contact layer and the electrode layer are stacked, the second step part is separated from the quantum well structure by the P-type contact layer, in such a manner that the second step part is not in contact with the quantum well structure, and wherein the epitaxial structure is provided at the substrate.

* * * * *